(12) United States Patent
Yanagida

(10) Patent No.: US 10,582,601 B2
(45) Date of Patent: Mar. 3, 2020

(54) EXTREME ULTRAVIOLET LIGHT GENERATING APPARATUS USING DIFFERING LASER BEAM DIAMETERS

(71) Applicant: Gigaphoton Inc., Tochigi (JP)

(72) Inventor: Tatsuya Yanagida, Oyama (JP)

(73) Assignee: Gigaphoton Inc., Tochigi (JP)

( * ) Notice: Subject to any disclaimer, the term of this patent is extended or adjusted under 35 U.S.C. 154(b) by 15 days.

(21) Appl. No.: 15/972,590

(22) Filed: May 7, 2018

(65) Prior Publication Data

US 2018/0255631 A1    Sep. 6, 2018

Related U.S. Application Data

(63) Continuation of application No. PCT/JP2015/085048, filed on Dec. 15, 2015.

(51) Int. Cl.
*H05G 2/00*      (2006.01)
*G03F 7/20*      (2006.01)

(52) U.S. Cl.
CPC ......... *H05G 2/008* (2013.01); *G03F 7/70033* (2013.01); *H05G 2/003* (2013.01)

(58) Field of Classification Search
CPC ........ H05G 2/008; H05G 2/005; H05G 2/003; H05G 2/006; F21K 2/00; G03F 7/70033
See application file for complete search history.

(56) References Cited

U.S. PATENT DOCUMENTS

| | | | |
|---|---|---|---|
| 9,113,540 B2 | 8/2015 | Hori et al. | |
| 2002/0141537 A1 | 10/2002 | Mochizuki | |
| 2006/0215712 A1 | 9/2006 | Ziener et al. | |
| 2010/0053581 A1 | 3/2010 | Swinkels et al. | |
| 2012/0243566 A1* | 9/2012 | Hori ................... | H01S 3/10061 372/27 |
| 2012/0248344 A1 | 10/2012 | Wakabayashi et al. | |
| 2012/0305811 A1* | 12/2012 | Wakabayashi ......... | H05G 2/003 250/504 R |

(Continued)

FOREIGN PATENT DOCUMENTS

| | | |
|---|---|---|
| JP | 2002-289397 A | 10/2002 |
| JP | 2010-003548 A | 1/2010 |

(Continued)

OTHER PUBLICATIONS

International Search Report issued in corresponding International Application No. PCT/JP2015/085048; dated Mar. 8, 2016.

(Continued)

*Primary Examiner* — Brooke Purinton
(74) *Attorney, Agent, or Firm* — Studebaker & Brackett PC

(57) ABSTRACT

An extreme ultraviolet light generating apparatus includes a target supply unit configured to output a target toward a predetermined region, a laser system configured to output a first laser beam with which the target is irradiated, a second laser beam with which the target is irradiated after being irradiated with the first laser beam, and a third laser beam with which the target is irradiated after being irradiated with the second laser beam, and an optical system configured to cause an irradiation beam diameter of the second laser beam at the target to be larger than an irradiation beam diameter of the third laser beam at the target.

20 Claims, 9 Drawing Sheets

(56) References Cited

U.S. PATENT DOCUMENTS

| | | |
|---|---|---|
| 2013/0320232 A1 | 12/2013 | Hori et al. |
| 2014/0077099 A1 | 3/2014 | Hori et al. |
| 2015/0102239 A1* | 4/2015 | Yanagida ............... H05G 2/005 250/504 R |
| 2016/0073487 A1 | 3/2016 | Yanagida et al. |

FOREIGN PATENT DOCUMENTS

| | | |
|---|---|---|
| JP | 2012-169241 A | 9/2012 |
| JP | 2013-004258 A | 1/2013 |
| JP | 2013-251100 A | 12/2013 |
| JP | 2015-029116 A | 2/2015 |
| WO | 2014/192872 A1 | 12/2014 |

OTHER PUBLICATIONS

International Preliminary Report on Patentability issued in corresponding International Application No. PCT/JP2015/085048; dated Jun. 19, 2018.

* cited by examiner

EXTREME ULTRAVIOLET LIGHT GENERATING APPARATUS USING DIFFERING LASER BEAM DIAMETERS

TECHNICAL FIELD

The present disclosure relates to an extreme ultraviolet light generating apparatus.

BACKGROUND ART

In recent years, as semiconductor processes become finer, transfer patterns for use in photolithography of semiconductor processes have rapidly become finer. In the next generation, micro-fabrication at 70 nm to 45 nm, and further, micro-fabrication at 32 nm or less would be demanded. In order to meet the demand for, for example, micro-fabrication at 32 nm or less, it is expected to develop an exposure apparatus in which an extreme ultraviolet light generating apparatus for generating extreme ultraviolet (EUV) light at a wavelength of approximately 13 nm is combined with a reduced projection reflective optical system.

Three types of EVN light generating apparatuses have been proposed, which include an LPP (laser produced plasma) type apparatus using plasma generated by irradiating target material with a pulse laser beam, a DPP (discharge produced plasma) type apparatus using plasma generated by an electric discharge, and an SR (synchrotron radiation) type apparatus using synchrotron radiation.

Patent Document 1: International Publication No. WO2014/192872 A
Patent Document 2: US Patent Application Publication No. 2006/215712 A
Patent Document 3: Japanese Patent Application Publication No. 2010-003548 A
Patent Document 4: US Patent Application Publication No. 2010/053581 A

SUMMARY

An extreme ultraviolet light generating apparatus according to an aspect of the present disclosure may include a target supply unit configured to output a target toward a predetermined region, a laser system configured to output a first laser beam with which the target is irradiated, a second laser beam with which the target is irradiated after being irradiated with the first laser beam, and a third laser beam with which the target is irradiated after being irradiated with the second laser beam, and an optical system configured to cause an irradiation beam diameter of the second laser beam at the target to be larger than an irradiation beam diameter of the third laser beam at the target.

BRIEF DESCRIPTION OF DRAWINGS

Embodiments of the present disclosure will be described below as mere examples with reference to the appended drawings.

FIG. 3A shows the target while being irradiated with the first pre-pulse laser beam P1. FIG. 3B shows the target while being irradiated with the second pre-pulse laser beam P2. FIGS. 3C and 3D show the target while being irradiated with the main pulse laser beam M.

FIG. 4A shows the target while being irradiated with the first pre-pulse laser beam P1. FIG. 4B shows the target while being irradiated with the second pre-pulse laser beam P2. FIGS. 4C and 4D show the target while being irradiated with the main pulse laser beam M.

FIG. 6A shows the target while being irradiated with the first pre-pulse laser beam P1. FIG. 6B shows the target while being irradiated with the second pre-pulse laser beam P2. FIGS. 6C and 6D show the target while being irradiated with the main pulse laser beam M.

FIG. 8 further shows a relationship between the fluence of the first pre-pulse laser beam P1 and an optimum value of a delay time T1M from the time of irradiation with the first pre-pulse laser beam P1 to the time of irradiation with the main pulse laser beam M.

DESCRIPTION OF EMBODIMENTS

Contents
1. Overall Description of Extreme Ultraviolet Light Generating System
  1.1 Configuration
  1.2 Operation
2. EUV Light Generating System Where Target Is Irradiated with
First to Third Laser Beams
  2.1 Configuration
    2.1.1 Target Supply Unit
    2.1.2 Target Sensor and Light-Emitting Unit
    2.1.3 Laser System
    2.1.4 Laser Beam Direction Control Unit
    2.1.5 Focusing Optical System
    2.1.6 EUV Collector Mirror and EUV Light Sensor 2.2 Operation
   2.2.1 Outputting Target
   2.2.2 Outputting Pulse Laser Beam
   2.2.3 Delivery of Pulse Laser Beam
   2.2.4 Concentrating Pulse Laser Beam
2.3 Change of Target Irradiated with Pulse Laser Beams
   2.3.1 Case Where Irradiation Beam Diameter of Second Pre-Pulse Laser Beam P2 Is Smaller Than Diameter of Secondary Target
   2.3.2 Case Where Irradiation Beam Diameter of Second Pre-Pulse Laser Beam P2 Is Equivalent to Diameter of Secondary Target
2.4 EUV Light Generating System Where Irradiation Beam Diameter of Second Pre-Pulse Laser Beam P2 Is Larger Than Irradiation Beam Diameter of Main Pulse Laser Beam M
   2.4.1 Configuration
   2.4.2 Change of Target Irradiated with Pulse Laser Beams
   2.4.3 Measurement Results
   2.4.4 Numerical Range of Irradiation Beam Diameter
      2.4.4.1 Diameter Dd of Droplet-Shaped Target
      2.4.4.2 Irradiation Beam Diameter D1 of First Pre-Pulse Laser Beam
      2.4.4.3 Irradiation Beam Diameter Dm of Main Pulse Laser Beam
      2.4.4.4 Irradiation Beam Diameter D2 of Second Pre-Pulse Laser Beam
   2.4.5 Range of Delay Time
   2.4.6 Fluence or Irradiation Intensity of Pulse Laser Beam
      2.4.6.1 Fluence of First Pre-Pulse Laser Beam
      2.4.6.2 Fluence of Second Pre-Pulse Laser Beam
      2.4.6.3 Irradiation Intensity of Main Pulse Laser Beam
3. Supplementary Explanation Embodiments of the present disclosure will be described in detail below with reference to the drawings. The embodiments described below may indicate several examples of the present disclosure and may not intend to limit the content of the present disclosure. Not all of the configurations and operations described in the embodiments are indispensable in the present disclosure.

Identical reference symbols may be assigned to identical constituent elements and redundant descriptions thereof may be omitted.

Figure 1:
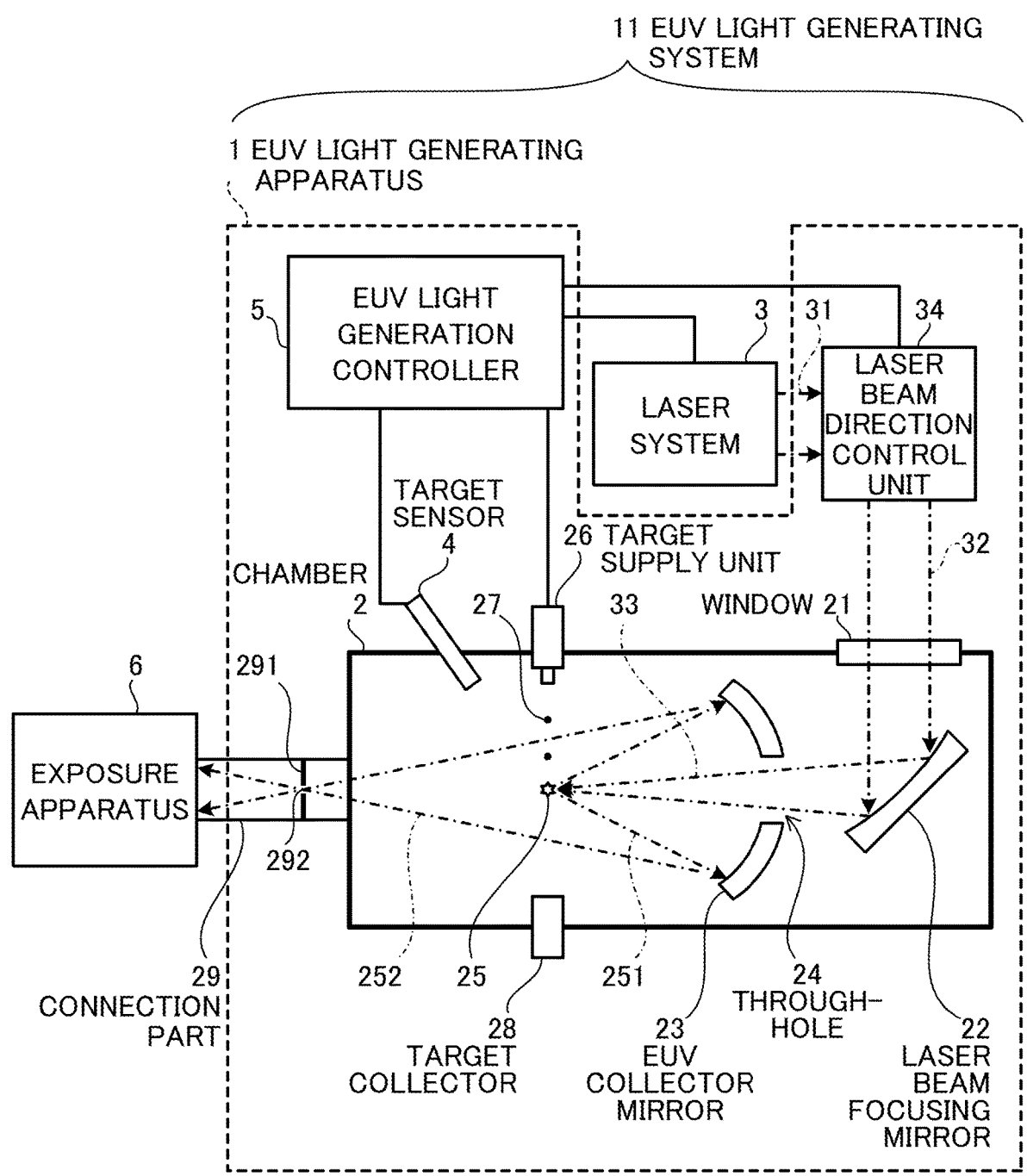
FIG. 1 schematically shows an exemplary configuration of an LPP type EUV light generating system.

1. Overall Description of Extreme Ultraviolet Light Generating System 1.1 Configuration FIG. 1 schematically shows an exemplary configuration of an LPP type EUV light generating system. An EUV light generating apparatus 1 may be used with at least one laser system 3. In the present application, a system including the EUV light generating apparatus 1 and the laser system 3 may be referred to as an EUV light generating system 11. As shown in FIG. 1 and described in detail below, the EUV light generating apparatus 1 may include a chamber 2 and a target supply unit 26. The chamber 2 may be sealed airtight. The target supply unit 26 may be provided, for example, to penetrate a wall of the chamber 2. A target material supplied by the target supply unit 26 may include, but not be limited to, tin, terbium, gadolinium, lithium, xenon, or a combination of any two or more of them.

The chamber 2 may have at least one through-hole formed in its wall. A window 21 may be provided at the through-hole. A pulse laser beam 32 outputted from the laser system 3 may be transmitted by the window 21. An EUV collector mirror 23 having a spheroidal reflective surface, for example, may be provided in the chamber 2. The EUV collector mirror 23 may have first and second focal points. The surface of the EUV collector mirror 23 may have, for example, a multi-layered reflective film in which molybdenum layers and silicon layers are alternately laminated. The EUV collector mirror 23 is preferably arranged such that, for example, the first focal point is positioned in a plasma generation region 25 and the second focal point is positioned in an intermediate focus region (IF) 292. The EUV collector mirror 23 may have a through-hole 24 at the center thereof, and a pulse laser beam 33 may pass through the through-hole 24.

The EUV light generating apparatus 1 may further include an EUV light generation controller 5 and a target sensor 4. The target sensor 4 may have a photographing function and may be configured to detect the presence, actual path, position, speed or the like of a target 27.

Further, the EUV light generating apparatus 1 may include a connection part 29 for allowing the interior of the chamber 2 to be in communication with the interior of an exposure apparatus 6. In the connection part 29, a wall 291 with an aperture may be provided. The wall 291 may be positioned such that the second focal point of the EUV collector mirror 23 lies in the aperture formed in the wall 291.

Furthermore, the EUV light generating apparatus 1 may include a laser beam direction control unit 34, a laser beam focusing mirror 22, a target collector 28 for collecting the target 27, and the like. The laser beam direction control unit 34 may include an optical system for defining the traveling direction of the pulse laser beam and an actuator for adjusting the position, the posture, or the like of the optical system.

1.2 Operation

With continued reference to FIG. 1, a pulse laser beam 31 outputted from the laser system 3 may enter the laser beam direction control unit 34 and be outputted therefrom as the pulse laser beam 32. The pulse laser beam 32 may be transmitted by the window 21 to enter the chamber 2. The pulse laser beam 32 may travel inside the chamber 2 along at least one laser beam optical path, be reflected by the laser beam focusing mirror 22, and be incident on the target 27 as the pulse laser beam 33.

The target supply unit 26 may be configured to output the target 27 toward the plasma generation region 25 in the chamber 2. The target 27 may be irradiated with at least one pulse of the pulse laser beam 33. The target 27 irradiated with the pulse laser beam 33 may be turned into plasma that emits rays of light 251. EUV light included in the light 251 may be reflected by the EUV collector mirror 23 at a higher reflectance than light in other wavelength regions. Reflected light 252 including the EUV light reflected by the UV collector mirror 23 may be collected at the intermediate focus region 292 and outputted to the exposure apparatus 6. Here, one target 27 may be irradiated with a plurality of pulses included in the pulse laser beam 33.

The EUV light generation controller 5 may be configured to integrally control the EUV light generating system 11. The EUV light generation controller 5 may process image data or the like of the target 27 photographed by the target sensor 4. Further, the EUV light generation controller 5 may control the timing at which the target 27 is outputted, the direction in which the target 27 is outputted, and the like. Furthermore, the EUV light generation controller 5 may control the oscillation timing of the laser system 3, the traveling direction of the pulse laser beam 32, the focus position of the pulse laser beam 33, and the like. The various controls described above are merely examples, and other controls may be added as necessary.

2. EUV Light Generating System where Target is Irradiated with First to Third Laser Beams

2.1 Configuration

Figure 2:
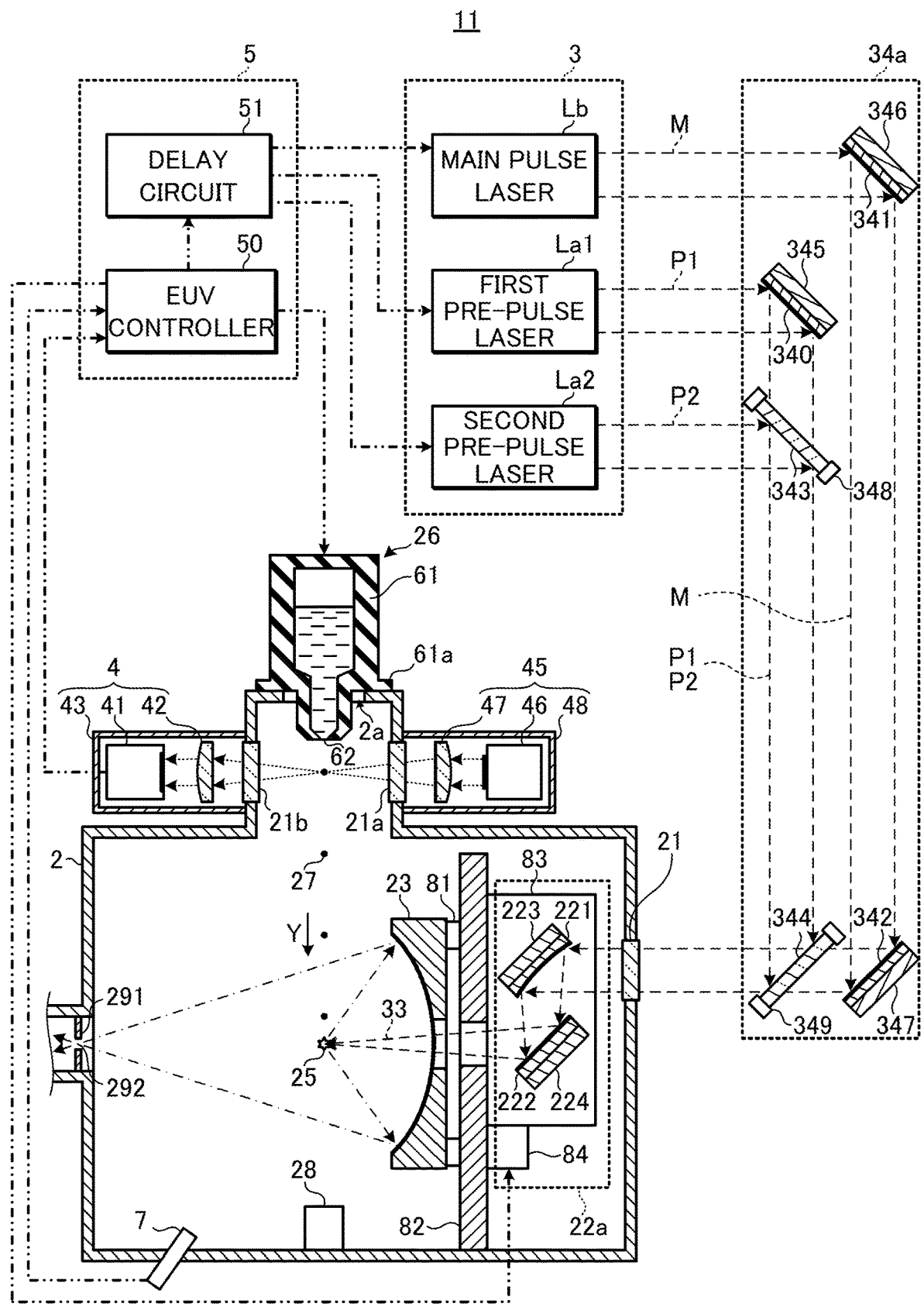
FIG. 2 is a partially sectional view showing a configuration of an EUVW light generating system 11 capable of being adapted to an embodiment of the present disclosure.

FIG. 2 is a partially sectional view showing a configuration of an EUV light generating system 11 capable of being adapted to an embodiment of the present disclosure. As shown in FIG. 2, a focusing optical system 22a, the EUV collector mirror 23, the target collector 28, EUV collector mirror holders 81, and plates 82 and 83 may be provided in the chamber 2. The target supply unit 26, the target sensor 4, a light-emitting unit 45, and an EUV light sensor 7 may be attached to the chamber 2.

The laser system 3, the laser beam direction control unit 34a, and the EUV light generation controller 5 may be provided outside the chamber 2. The EUV light generation controller 5 may include an EUV controller 50 and a delay circuit 51.

2.1.1 Target Supply Unit

The target supply unit 26 may include a reservoir 61. A part of the reservoir 61 may penetrate the wall of the chamber 2 through a through-hole 2a. The bottom end of the reservoir 61 may be inside the chamber 2. An opening 62 may be formed at the bottom end of the reservoir 61. An unillustrated vibrator may be provided in the vicinity of the opening 62 at the bottom end of the reservoir 61. A flange portion 61a of the reservoir 61 may closely contact and be fixed to the wall of the chamber 2 surrounding the through-hole 2a.

The reservoir 61 may store molten target material. An unillustrated heater accompanying the reservoir 61 may keep the target material at a temperature equal to or higher than the melting point. Inert gas may be supplied to the target supply unit 26 to apply pressure to the target material in the reservoir 61.

2.1.2 Target Sensor and Light-Emitting Unit

The target sensor 4 and the light-emitting unit 45 may be provided opposite to each other across the trajectory of the target 27. The chamber 2 may have windows 21a and 21b. The window 21a may be provided between the light-emitting unit 45 and the trajectory of the target 27. The window 21b may be provided between the trajectory of the target 27 and the target sensor 4.

The target sensor 4 may include an optical sensor 41, a focusing optical system 42, and a container 43. The container 43 may be fixed to the outside surface of the chamber 2. The optical sensor 41 and the focusing optical system 42 may be provided in the container 43. The light-emitting unit 45 may include a light source 46, a focusing optical system 47, and a container 48. The container 48 may be fixed to the outside surface of the chamber 2. The light source 46 and the focusing optical system 47 may be provided in the container 48.

The light outputted from the light source 46 may be concentrated by the focusing optical system 47 at a position between the target supply unit 26 and the plasma generation region 25 around the trajectory of the target 27. When the target 27 passes through the focus position of the light from the light-emitting unit 45, the target sensor 4 may detect the change in the intensity of the light passing through the trajectory of the target 27 and its surrounding region. The target sensor 4 may then output a target detection signal.

2.1.3 Laser System

The laser system 3 may include a first pre-pulse laser La1, a second pre-pulse laser La2, and a main pulse laser Lb. The first pre-pulse laser La1 and the second pre-pulse laser La2 may each be a YAG laser apparatus. They may each be a laser apparatus using Nd:YVO$_4$. The main pulse laser Lb may be a CO$_2$ laser apparatus. The YAG laser apparatus may be a laser including a laser oscillator and, if necessary, a laser amplifier. The YAG laser apparatus may include a YAG crystal as a laser medium in either one or both of the laser oscillator and the laser amplifier. The CO$_2$ laser apparatus may be a laser including a laser oscillator and, if necessary, a laser amplifier. The CO$_2$ laser apparatus may include CO$_2$ gas as a laser medium in either one or both of the laser oscillator and the laser amplifier.

The first pre-pulse laser La1 may output a first pre-pulse laser beam P1. The first pre-pulse laser beam P1 may correspond to a first laser beam of the present disclosure. The second pre-pulse laser La2 may output a second pre-pulse laser beam P2. The second pre-pulse laser beam P2 may correspond to a second laser beam of the present disclosure. The main pulse laser Lb may output a main pulse laser beam M. The main pulse laser beam M may correspond to a third laser beam of the present disclosure.

2.1.4 Laser Beam Direction Control Unit

The laser beam direction control unit 34a may include high-reflective mirrors 340, 341 and 342, and beam combiners 343 and 344. The high-reflective mirror 340 may be held by a holder 345. The high-reflective mirror 341 may be held by a holder 346. The high-reflective mirror 342 may be held by a holder 347.

The beam combiner 343 may be held by a holder 348. The beam combiner 343 may include a polarizer. The polarizer may transmit a beam linearly polarized in a direction parallel to the paper surface of the figure at a high transmittance and reflect another beam linearly polarized in a direction perpendicular to the paper surface of the figure at a high reflectance. The polarizer may thus allow the optical paths of the two beams to substantially coincide with each other.

The beam combiner 344 may be held by a holder 349. The beam combiner 344 may include a dichroic mirror. The dichroic mirror may transmit a beam including a first wavelength component at a high transmittance and reflect another beam including a second wavelength component at a high reflectance. The dichroic mirror may thus allow the optical paths of the two beams to substantially coincide with each other.

If the first pre-pulse laser beam P1 and the second pre-pulse laser beam P2 have different wavelength components from each other, the beam combiner 343 may also be a dichroic mirror.

2.1.5 Focusing Optical System

The plate 82 may be fixed to the chamber 2. The plate 83 may be held by the plate 82. The focusing optical system 22a may include an off-axis paraboloidal mirror 221 and a planar mirror 222. The off-axis paraboloidal mirror 221 may be held by a holder 223. The planar mirror 222 may be held by a holder 224. The holders 223 and 224 may be fixed to the plate 83.

The position-adjusting mechanism 84 may be capable of adjusting the position of the plate 83 relative to the plate 82 according to a control signal outputted from the EUV controller 50. Adjusting the position of the plate 83 may cause the positions of the off-axis paraboloidal mirror 221 and the planar mirror 222 to be adjusted. The positions of the off-axis paraboloidal mirror 221 and the planar mirror 222 may be adjusted such that the pulse laser beam 33 reflected by these mirrors is concentrated at the plasma generation region 25.

2.1.6 EUV Collector Mirror and EUV Light Sensor

The EUV collector mirror 23 may be fixed to the plate 82 by the EUV collector mirror holders 81. The EUV light sensor 7 may receive a part of the EUV light generated in the plasma generation region 25 to detect the energy or the intensity of the EUV light. The EUV light sensor 7 may output the results of the detection to the EUV controller 50.

2.2 Operation

2.2.1 Outputting Target

The EUV controller 50 included in the EUV light generation controller 5 may output a control signal to the target supply unit 26 such that the target supply unit 26 outputs the target 27.

A part of the target material to which the inert gas has applied pressure in the target supply unit 26 may be outputted via the opening 62. The vibration of the target supply unit 26 given by the vibrator may cause the outputted target material to be separated into a plurality of droplets. Each of the droplets may move as the target 27 along the trajectory from the target supply unit 26 to the plasma generation region 25 in a direction shown by an arrow Y.

The target collector 28 may be provided on the extension line of the trajectory of the target 27 to collect the target 27 having passed through the plasma generation region 25.

The EUV controller 50 may receive the target detection signal outputted from the target sensor 4.

2.2.2 Outputting Pulse Laser Beam

The EUV controller 50 may output an oscillation trigger signal to the delay circuit 51 based on the target detection signal. The delay circuit 51 may output a first trigger signal, showing that a first delay time has passed since the time of receiving the oscillation trigger signal, to the first pre-pulse laser La1. The first pre-pulse laser La1 may output the first pre-pulse laser beam P1 according to the first trigger signal.

The delay circuit 51 may output a second trigger signal, showing that a second delay time longer than the first delay time has passed since the time of receiving the oscillation trigger signal, to the second pre-pulse laser La2. The second pre-pulse laser La2 may output the second pre-pulse laser beam P2 according to the second trigger signal.

The delay circuit 51 may output a third trigger signal, showing that a third delay time longer than the second delay time has passed since the time of receiving the oscillation trigger signal, to the main pulse laser Lb. The main pulse laser Lb may output the main pulse laser beam M according to the third trigger signal.

The difference between the first delay time and the third delay time may correspond to a delay time T1M from the time of irradiation with the first pre-pulse laser beam P1 to the time of irradiation with the main pulse laser beam M. The difference between the second delay time and the third delay time may correspond to a delay time T2M from the time of irradiation with the second pre-pulse laser beam P2 to the time of irradiation with the main pulse laser beam M. The delay times T1M and T2M will be described below.

The laser system 3 may thus output the first pre-pulse laser beam P1, the second pre-pulse laser beam P2, and the main pulse laser beam M in this order. The first pre-pulse laser beam P1 may preferably have a pulse width of picosecond order. The pulse width of picosecond order may be 1 ps or more, and less than 1 ns. The pulse width of the second pre-pulse laser beam P2 may preferably be shorter than the pulse width of the main pulse laser beam M.

2.2.3 Delivery of Pulse Laser Beam

The high-reflective mirror 340 included in the laser beam direction control unit 34a may be provided in the optical path of the first pre-pulse laser beam P1 outputted from the first pre-pulse laser La1. The high-reflective mirror 340 may reflect the first pre-pulse laser beam P1 at a high reflectance.

The beam combiner 343 may be provided at an intersecting position where the optical path of the first pre-pulse laser beam P1 reflected by the high-reflective mirror 340 and the optical path of the second pre-pulse laser beam P2 outputted from the second pre-pulse laser La2 intersect each other. The first pre-pulse laser beam P1 may be linearly polarized in a direction parallel to the paper surface of the figure. The second pre-pulse laser beam P2 may be linearly polarized in a direction perpendicular to the paper surface of the figure.

The first pre-pulse laser beam P1 may be incident on the beam combiner 343 from the upper side in the figure. The second pre-pulse laser beam P2 may be incident on the beam combiner 343 from the left side in the figure. The beam combiner 343 may transmit the first pre-pulse laser beam P1 at a high transmittance and reflect the second pre-pulse laser beam P2 at a high reflectance to allow these beams to be incident on the beam combiner 344.

The high-reflective mirrors 341 and 342 may be provided in the optical path of the main pulse laser beam M outputted from the main pulse laser Lb. The high-reflective mirrors 341 and 342 may reflect in this order the main pulse laser beam M at a high reflectance.

The beam combiner 344 may be provided at an intersecting position where the combined optical paths of the first and second pre-pulse laser beams P1 and P2 and the optical path of the main pulse laser beam M reflected by the high-reflective mirror 342 intersect each other. The main pulse laser beam M may include a wavelength component different from that included in the first and second pre-pulse laser beams P1 and P2.

The first and second pre-pulse laser beams P1 and P2 may be incident on the beam combiner 344 from the upper side in the figure. The main pulse laser beam M may be incident on the beam combiner 344 from the right side in the figure. The beam combiner 344 may reflect the first and second pre-pulse laser beams P1 and P2 at a high reflectance and transmit the main pulse laser beam M at a high transmittance to allow these beams as the pulse laser beam 32 to enter the focusing optical system 22a.

2.2.4 Concentrating Pulse Laser Beam

The off-axis paraboloidal mirror 221 included in the focusing optical system 22a may be provided in the optical path of the pulse laser beam 32. The off-axis paraboloidal mirror 221 may reflect the pulse laser beam 32 to the planar mirror 222. The planar mirror 222 may reflect the pulse laser beam 32 reflected by the off-axis paraboloidal mirror 221 as the pulse laser beam 33 to the plasma generation region 25 or its vicinity. The pulse laser beam 33 may be concentrated at the plasma generation region 25 or its vicinity according to the shape of the reflective surface of the off-axis paraboloidal mirror 221.

In the plasma generation region 25 or its vicinity, one target 27 may be irradiated with the first pre-pulse laser beam P1, the second pre-pulse laser beam P2, and the main pulse laser beam M in this order. The droplet-shaped target 27 irradiated with the first pre-pulse laser beam P1 may be broken into multiple particles to be diffused, being turned into a secondary target. The secondary target irradiated with the second pre-pulse laser beam P2 may be turned into a tertiary target including at least vapor or pre-plasma of the target material. The tertiary target irradiated with the main pulse laser beam M may be efficiently turned into plasma, generating the EUV light. However, the present disclosure may not be limited to this. The target may be irradiated with a fourth laser beam after being irradiated with the first pre-pulse laser beam P1 and before being irradiated with the second pre-pulse laser beam P2. The target may be irradiated with a fifth laser beam after being irradiated with the second pre-pulse laser beam P2 and before being irradiated with the main pulse laser beam M.

Figure 3A:
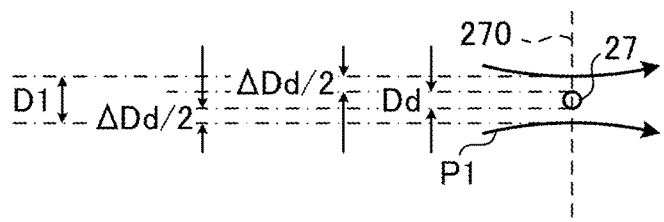
FIGS. 3A to 3D schematically show a target in a first comparative example in which the irradiation beam diameter of the second pre-pulse laser beam P2 is smaller than the diameter of a secondary target.
Figure 3B:
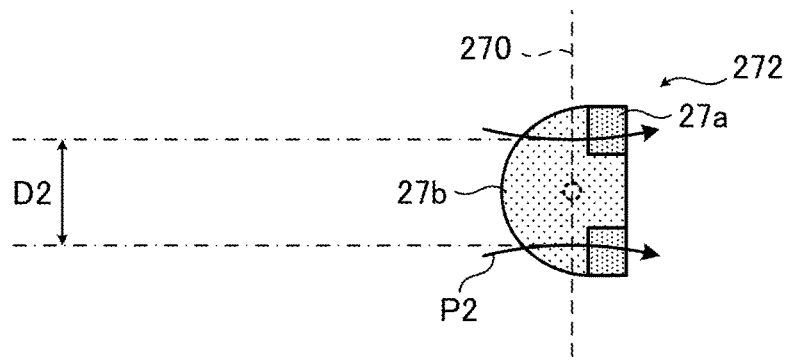
Figure 3C:
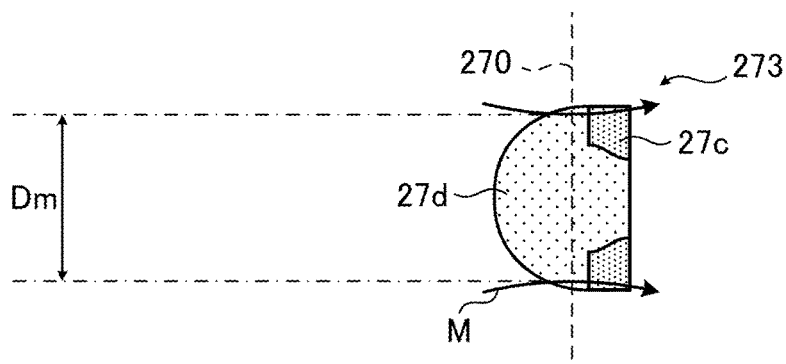
Figure 3D:
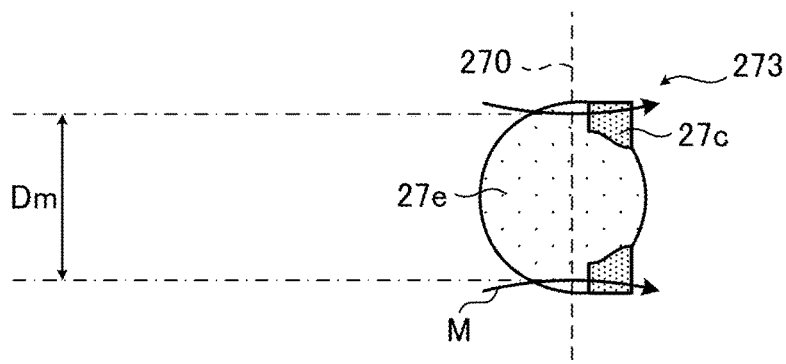

2.3 Change of Target Irradiated with Pulse Laser Beams 2.3.1 Case where Irradiation Beam Diameter of Second Pre-Pulse Laser Beam P2 Is Smaller Than Diameter of Secondary Target FIGS. 3A to 3D schematically show a target in the EUV light generating system shown in FIG. 2. FIG. 3A shows the target while being irradiated with the first pre-pulse laser beam P1. FIG. 3B shows the target while being irradiated with the second pre-pulse laser beam P2. FIGS. 3C and 3D show the target while being irradiated with the main pulse laser beam M. FIGS. 3A to 3D show a first comparative example in which the irradiation beam diameter D2 of the second pre-pulse laser beam P2 is smaller than the diameter of a secondary target 272. A broken line 270 shows the trajectory of the target 27 and its extension line.

In the present disclosure, "an irradiation beam diameter" may mean a diameter of a section of an optical path of a pulse laser beam at a position of a target irradiated with the pulse laser beam. If the target is at the position where the pulse laser beam is concentrated by the focusing optical system 22a, the irradiation beam diameter may correspond to the spot diameter.

As shown in FIG. 3A, let the diameter of the target 27 be Dd. Let the deviation of the position of the target 27 when the target 27 is irradiated with the first pre-pulse laser beam P1 be ΔDd. The deviation ΔDd of the position of the target 27 may be a sum of the shift amount ΔDd/2 of the position of the target 27 in the upward direction in FIG. 3A and that in the downward direction in FIG. 3A. The irradiation beam diameter D1 of the first pre-pulse laser beam P1 may be adjusted to Dd+ΔDd.

Irradiating the droplet-shaped target 27 with the first pre-pulse laser beam P1 may cause the droplet-shaped target 27 to be broken into multiple particles to be diffused, and thus to be turned into the secondary target 272 shown in FIG. 3B. The density of dots in FIGS. 3B to 3D may correspond to the density of the target material. The secondary target 272 shown in FIG. 3B, generated by applying the first pre-pulse laser beam P1 having the pulse width of picosecond order to the target 27, may include a ring portion 27a and a dome portion 27b. The ring portion 27a may be a region formed by diffusing the target material in the downstream direction of the optical path of the first pre-pulse laser beam P1. The density of the target material in the ring portion 27a may be relatively high. The dome portion 27b may be a region formed by diffusing the target material in the upstream direction of the optical path of the first pre-pulse laser beam P1. The density of the target material in the dome portion 27b may be relatively low. The upstream direction of the optical path may be a direction along the optical path to approach the light source. The downstream direction of the optical path may be a direction along the optical path to go away from the light source.

As shown in FIG. 3B, the secondary target 272 may be irradiated with the second pre-pulse laser beam P2. In the first comparative example, the irradiation beam diameter D2 of the second pre-pulse laser beam P2 at the secondary target 272 may be smaller than the diameter of the secondary target 272.

Irradiating the secondary target 272 with the second pre-pulse laser beam P2 may cause the secondary target 272 to be broken into finer particles, vaporized, or turned into pre-plasma, and thus to be turned into a tertiary target 273 shown in FIG. 3C.

The tertiary target 273 may include a dome portion 27d where the dome portion 27b of the secondary target 272 is broken into finer particles, vaporized, or turned into pre-plasma. The ring portion 27a of the secondary target 272 may only be irradiated with a peripheral part of the second pre-pulse laser beam P2 having a low intensity, or substantially not be irradiated. The most part of the ring portion 27a may thus remain in the tertiary target 273 as a ring portion 27c having a relatively high density of the target material.

Irradiating the tertiary target 273 with the main pulse laser beam M may cause a part of the tertiary target 273 to be turned into plasma. The dome portion 27d included in the tertiary target 273 may have a low density of the target material and efficiently absorb the energy of the main pulse laser beam M. The most part of the dome portion 27d may thus be turned into plasma. The plasma may emit the EUV light. FIG. 3D shows the tertiary target 273 in the second half of the pulse width of the main pulse laser beam M. A dome portion 27e including plasma may have a lower density of the target material than the dome portion 27d.

The ring portion 27c included in the tertiary target 273 may have a relatively high density of the target material. If the density of the target material is higher than a threshold value, the target material may tend to reflect the main pulse laser beam M and be hard to absorb the energy of the main pulse laser beam M. Generation of plasma from the ring portion 27c may thus be insufficient and the conversion efficiency from the energy of the laser beam to the energy of the EUV light may be low.

Figure 4A:
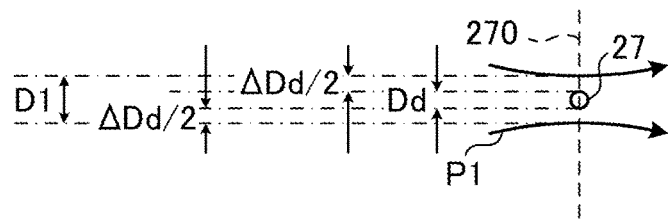
FIGS. 4A to 4D schematically show a target in a second comparative example in which the irradiation beam diameter of the second pre-pulse laser beam P2 is equivalent to the diameter of the secondary target.
Figure 4B:
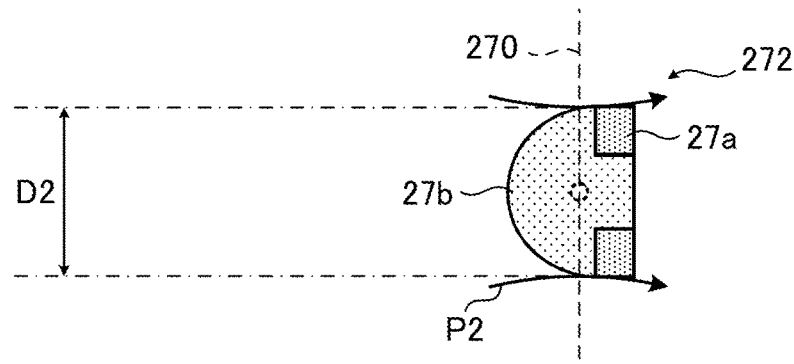
Figure 4C:
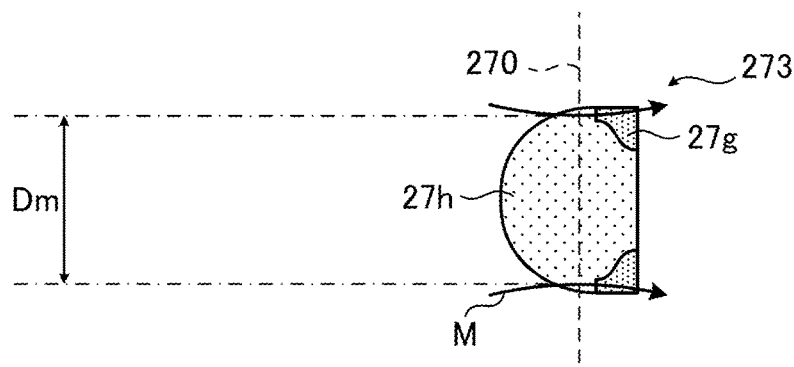
Figure 4D:
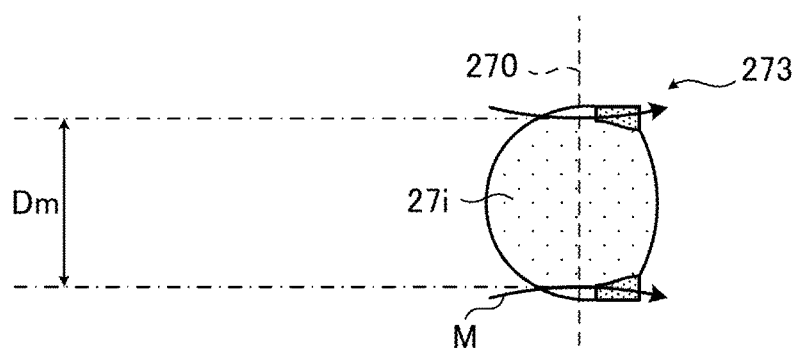

2.3.2 Case where Irradiation Beam Diameter of Second Pre-Pulse Laser Beam P2 is Equivalent to Diameter of Secondary Target FIGS. 4A to 4D schematically show a target in the EUV light generating system shown in FIG. 2. FIG. 4A shows the target while being irradiated with the first pre-pulse laser beam P1. FIG. 4B shows the target while being irradiated with the second pre-pulse laser beam P2. FIGS. 4C and 4D show the target while being irradiated with the main pulse laser beam M. FIGS. 4A to 4D show a second comparative example in which the irradiation beam diameter D2 of the second pre-pulse laser beam P2 is equivalent to the diameter of the secondary target 272. The relationship between the target 27 shown in FIG. 4A and the first pre-pulse laser beam P1 may be substantially the same as that described with reference to FIG. 3A. The secondary target 272 shown in FIG. 4B may be substantially the same as that described with reference to FIG. 3B. A broken line 270 shows the trajectory of the target 27 and its extension line. The density of dots in FIGS. 4B to 4D may correspond to the density of the target material.

In the second comparative example, the irradiation beam diameter D2 of the second pre-pulse laser beam P2 may be equivalent to the diameter of the secondary target 272. In this case, the tertiary target 273 generated by applying the second pre-pulse laser beam P2 to the secondary target 272 may include a dome portion 27h where the dome portion 27b of the secondary target 272 is broken into finer particles, vaporized, or turned into pre-plasma. Since the whole secondary target 272 including the ring portion 27a may be irradiated with the second pre-pulse laser beam P2, the density of the target material at an inner part of the ring portion 27a may be reduced. However, an outer part of the ring portion 27a may only be irradiated with the peripheral part of the second pre-pulse laser beam P2 having a low intensity. The outer part of the ring portion 27a may thus remain in the tertiary target 273 as a ring portion 27g having a relatively high density of the target material.

Irradiating the tertiary target 273 with the main pulse laser beam M may cause a part of the tertiary target 273 to be turned into plasma. The most part of the tertiary target 273 may have a low density of the target material and efficiently absorb the energy of the main pulse laser beam M. The most part of the tertiary target 273 may thus be turned into plasma. The conversion efficiency from the energy of the laser beam to the energy of the EUV light may thus be improved. FIG. 4D shows the tertiary target 273 in the second half of the pulse width of the main pulse laser beam M.

However, if the energy of the main pulse laser beam M is raised to improve the energy of the EUV light, the conversion efficiency from the energy of the laser beam to the energy of the EUV light may be reduced.

In the embodiment described below, the irradiation beam diameter D2 of the second pre-pulse laser beam P2 may be larger than the irradiation beam diameter Dm of the main pulse laser beam M. The reduction of the conversion efficiency from the energy of the laser beam to the energy of the EUV light may thus be moderated.

Figure 5:
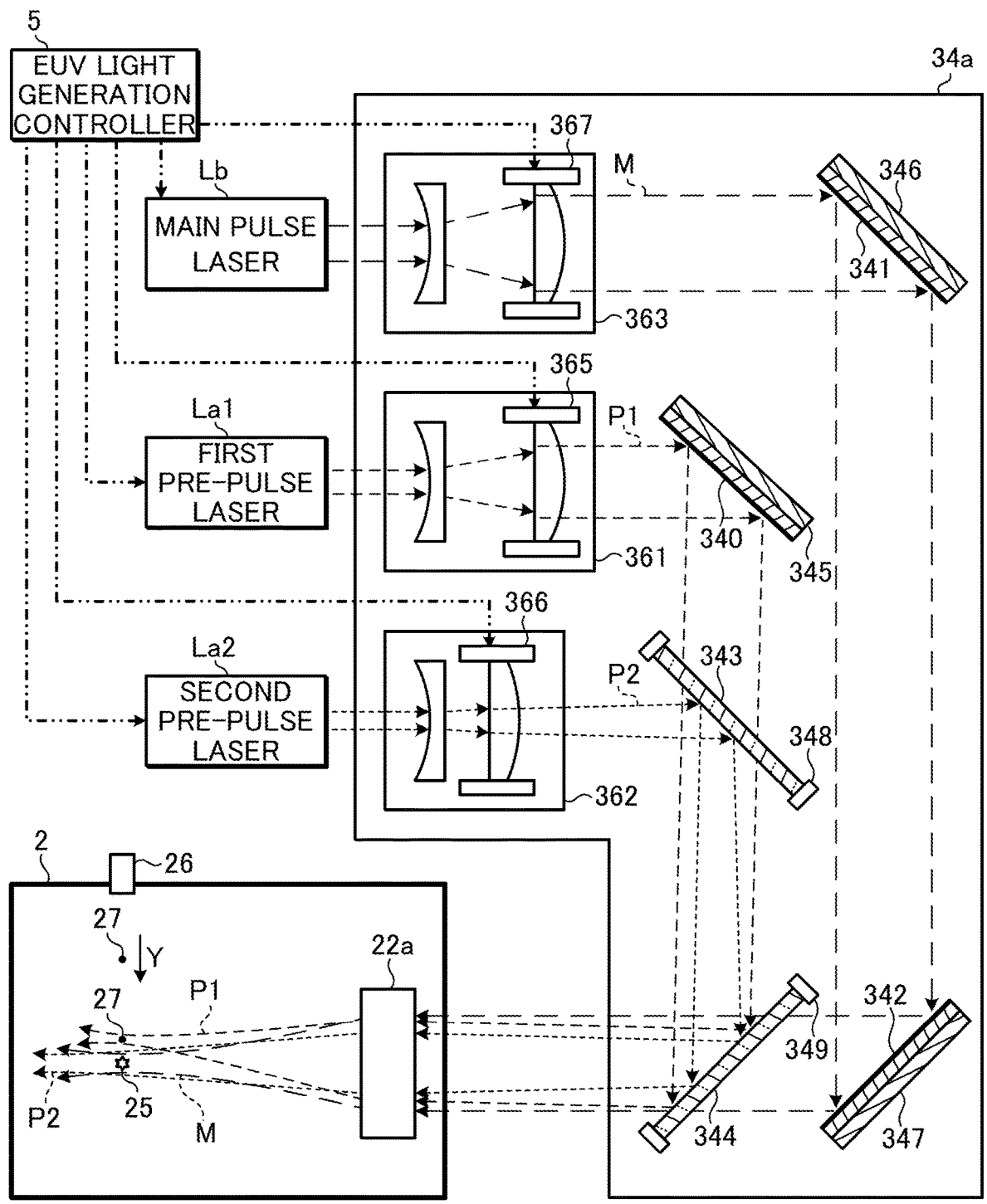
FIG. 5 schematically shows an exemplary configuration of a laser beam direction control unit 34a and other elements of the EUV light generating system 11 according to the embodiment of the present disclosure.

2.4 EUV Light Generating System where Irradiation Beam Diameter of Second Pre-Pulse Laser Beam P2 is Larger than Irradiation Beam Diameter of Main Pulse Laser Beam M 2.4.1 Configuration FIG. 5 schematically shows an exemplary configuration of a laser beam direction control unit 34a and other elements of the EUV light generating system 11 according to the embodiment of the present disclosure. An illustration is omitted for the configuration of the EUV collector mirror 23, the target sensor 4, and the like accompanying the chamber 2. A specific illustration is omitted for the configuration of the focusing optical system 22a and the target supply unit 26.

As shown in FIG. 5, the laser beam direction control unit 34a may be an optical system further including a first beam expander 361, a second beam expander 362, and a third beam expander 363.

The first beam expander 361 may be provided at a position in the optical path of the first pre-pulse laser beam P1, other than the optical path of the second pre-pulse laser beam P2 and the optical path of the main pulse laser beam M. The second beam expander 362 may be provided at a position in the optical path of the second pre-pulse laser beam P2, other than the optical path of the first pre-pulse laser beam P1 and the optical path of the main pulse laser beam M. The third beam expander 363 may be provided at a position in the optical path of the main pulse laser beam M, other than the optical path of the first pre-pulse laser beam P1 and the optical path of the second pre-pulse laser beam P2.

The first beam expander 361, the second beam expander 362, and the third beam expander 363 may each include a spherical concave lens and a spherical convex lens. Alternatively, the third beam expander 363 may include an unillustrated spherical convex mirror and an unillustrated spherical concave mirror to bear a large thermal load. The spherical convex lens included in the first beam expander 361 may be equipped with an actuator 365. The spherical convex lens included in the second beam expander 362 may be equipped with an actuator 366. The spherical convex lens or the unillustrated spherical concave mirror included in the third beam expander 363 may be equipped with an actuator 367.

The actuators 365, 366, and 367 may be capable of moving the respective spherical convex lenses or the unillustrated spherical concave mirror along the respective optical path axes of the pulse laser beams. The first to third beam expanders 361 to 363 may thus adjust the wavefront and the beam diameter of the first pre-pulse laser beam P1, those of the second pre-pulse laser beam P2, and those of the main pulse laser beam M, respectively. Adjusting the wavefront and the beam diameter may cause the irradiation beam diameter at the target to be adjusted. The first to third beam expanders 361 to 363 may correspond to adjustment mechanisms to adjust the irradiation beam diameters of the first pre-pulse laser beam P1, the second pre-pulse laser beam P2, and the main pulse laser beam M, respectively.

In the embodiment of the present disclosure, the irradiation beam diameter D1 of the first pre-pulse laser beam P1 may have a value obtained by adding the deviation $\Delta Dd$ of the position of the target 27 to the diameter Dd of the target 27. The irradiation beam diameter D2 of the second pre-pulse laser beam P2 may be larger than the diameter of the secondary target 272 generated by applying the first pre-pulse laser beam P1 to the target 27. The irradiation beam diameter Dm of the main pulse laser beam M may be smaller than the diameter of the tertiary target 273 generated by applying the second pre-pulse laser beam P2 to the secondary target 272. The irradiation beam diameter D2 of the second pre-pulse laser beam P2 may be larger than the irradiation beam diameter Dm of the main pulse laser beam M.

To achieve a large irradiation beam diameter D2 of the second pre-pulse laser beam P2, the focus position of the second pre-pulse laser beam P2 focused by the focusing optical system 22a may be at a position downstream from the position of the target 27 in the optical path of the second pre-pulse laser beam P2. To focus the second pre-pulse laser beam P2 at the position downstream in the optical path, the second pre-pulse laser beam P2 to be incident on the focusing optical system 22a may be adjusted to have a convex wavefront such that the second pre-pulse laser beam P2 has a predetermined diverging angle. Alternatively, the focus position of the second pre-pulse laser beam P2 focused by the focusing optical system 22a may be at a position upstream from the position of the target 27 in the optical path of the second pre-pulse laser beam P2. To focus the second pre-pulse laser beam P2 at the position upstream in the optical path, the second pre-pulse laser beam P2 to be incident on the focusing optical system 22a may be adjusted to have a concave wavefront.

In the period from the time of irradiation of the target 27 with the first pre-pulse laser beam P1 to the time of irradiation of the secondary target 272 with the second pre-pulse laser beam P2, the secondary target 272 may move in the direction shown by the arrow Y. As shown in FIG. 5, the position where the optical path axis of the first pre-pulse laser beam P1 substantially intersects the trajectory of the target 27 may be nearer the target supply unit 26 than the plasma generation region 25.

Further, the optical path axis of the second pre-pulse laser beam P2 and the optical path axis of the main pulse laser beam M may pass through the plasma generation region 25.

2.4.2 Change of Target Irradiated with Pulse Laser Beams

Figure 6A:
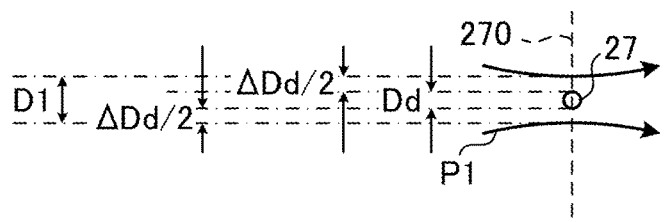
FIGS. 6A to 6D schematically show a target in the embodiment of the present disclosure.
Figure 6B:
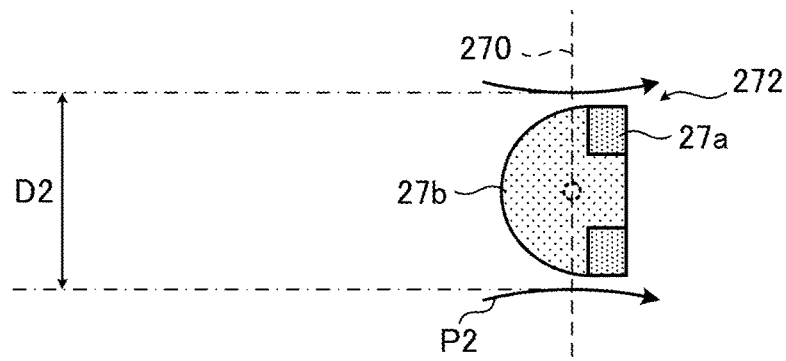
Figure 6C:
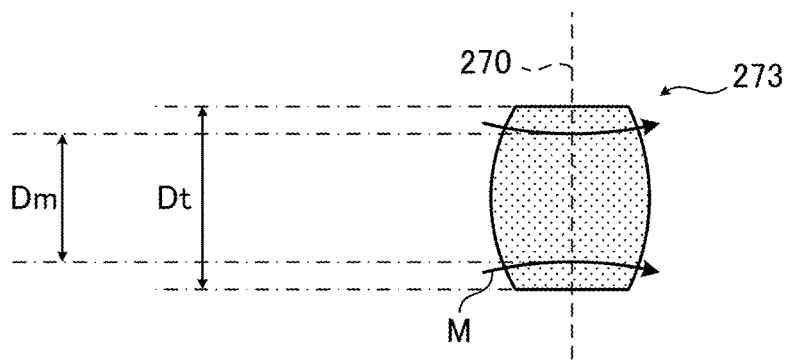
Figure 6D:
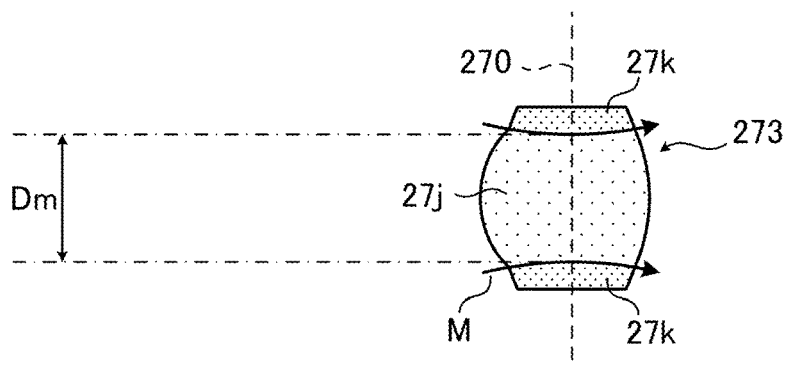

FIGS. 6A to 6D schematically show a target in the embodiment of the present disclosure. FIG. 6A shows the target while being irradiated with the first pre-pulse laser beam P1. FIG. 6B shows the target while being irradiated with the second pre-pulse laser beam P2. FIGS. 6C and 6D show the target while being irradiated with the main pulse laser beam M. The relationship between the target 27 and the first pre-pulse laser beam P1 shown in FIG. 6A may be substantially the same as that described with reference to FIG. 3A. The secondary target 272 shown in FIG. 6B may be substantially the same as that described with reference to FIG. 3B. A broken line 270 shows the trajectory of the target 27 and its extension line. The density of dots in FIGS. 6B to 6D may correspond to the density of the target material.

The irradiation beam diameter D2 of the second pre-pulse laser beam P2 may preferably be larger than the diameter of the secondary target 272. In this case, the tertiary target 273 generated by applying the second pre-pulse laser beam P2 to the secondary target 272 may be a lump where the dome portion 27b and the ring portion 27a of the secondary target 272 are broken into finer particles, vaporized, or turned into pre-plasma, and they join together, as shown in FIG. 6C. The tertiary target 273 may be diffused and expanded as time passes.

The lump of the tertiary target 273 may be irradiated with the main pulse laser beam M. In the embodiment of the present disclosure, the irradiation beam diameter Dm of the main pulse laser beam M may preferably be smaller than the irradiation beam diameter D2 of the second pre-pulse laser beam P2. An inner part of the tertiary target 273, other than an outer part of the tertiary target 273, may be irradiated with the main pulse laser beam M. The tertiary target 273 may have a low density of the target material and efficiently absorb the energy of the main pulse laser beam M. The conversion efficiency from the energy of the laser beam to the energy of the EUV light may thus be improved.

In the example of FIGS. 4A to 4D, raising the energy of the main pulse laser beam N may cause the reduction of the conversion efficiency from the energy of the laser beam to the energy of the EUV light. In FIGS. 6A to 6D, however, the reduction of the conversion efficiency due to raising the energy of the main pulse laser beam M may be moderated. The reason for this may be supposed as follows.

In the example of FIGS. 4A to 4D, the target material may efficiently absorb the energy of the first half of the pulse width of the main pulse laser beam M. However, the high energy of the main pulse laser beam M may cause the target material to rapidly expand to reduce the density of the target material before the end of the pulse width of the main pulse laser beam M. Accordingly, in the second half of the pulse width of the main pulse laser beam M, a quite low density of the target material may cause the reduction of the conversion efficiency from the energy of the laser beam to the energy of the EUV light.

In FIGS. 6A to 6D, however, an outer part 27k of the tertiary target 273 outside the irradiation beam diameter of the main pulse laser beam M may not necessarily be irradiated with the main pulse laser beam M. In this case, even if the energy of the main pulse laser beam M is high, the rapid expansion of the target material may be suppressed by the outer part 27k. Even if the target material rapidly expands, the outer part 27k may supply target material to the region within the irradiation beam diameter of the main pulse laser beam M. This may moderate the reduction of the density of the target material within the irradiation beam diameter of the main pulse laser beam M. Accordingly, the reduction of the conversion efficiency due to a high energy of the main pulse laser beam M may be moderated.

2.4.3 Measurement Results

Figure 7A:
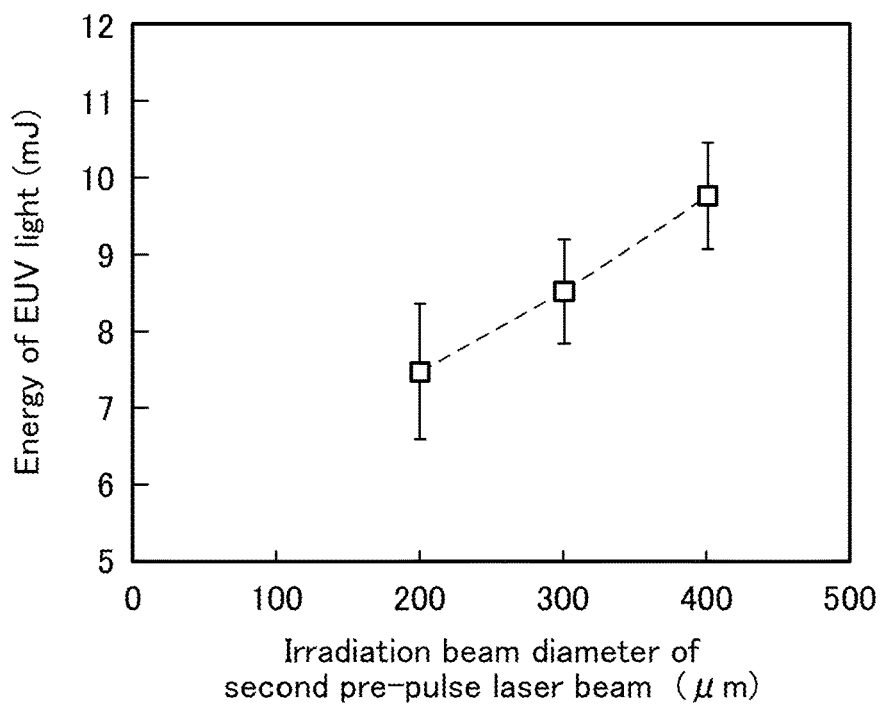
FIG. 7A is a graph showing a relationship between the irradiation beam diameter of the second pre-pulse laser beam and the energy of the EUV light.

FIG. 7A is a graph showing a relationship between the irradiation beam diameter of the second pre-pulse laser beam P2 and the energy of the EUV light. In FIG. 7A, a tin droplet having a diameter of 25 μm was used as the target 27.

For the first pre-pulse laser beam P1, the irradiation beam diameter was 80 μm, the pulse width was 14 ps, and the pulse energy was 0.77 mJ. For the second pre-pulse laser beam P2, the pulse width was 6 ns, the fluence was 10.0 J/cm$^2$, and the measurement was made with a plurality of values of the irradiation beam diameter D2. For the main pulse laser beam M, the irradiation beam diameter was 325 μm, the pulse width was 15 ns, and the pulse energy was 240 mJ.

As shown in FIG. 7A, the energy of the EUV light was higher in the case where the irradiation beam diameter D2 of the second pre-pulse laser beam P2 was 300 μm than in the case where that was 200 μm. Further, the energy of the EUV light was higher in the case where the irradiation beam diameter D2 of the second pre-pulse laser beam P2 was 400 μm, which is larger than the irradiation beam diameter of 325 μm of the main pulse laser beam M, than in the case where that was 300 μm.

Figure 7B:
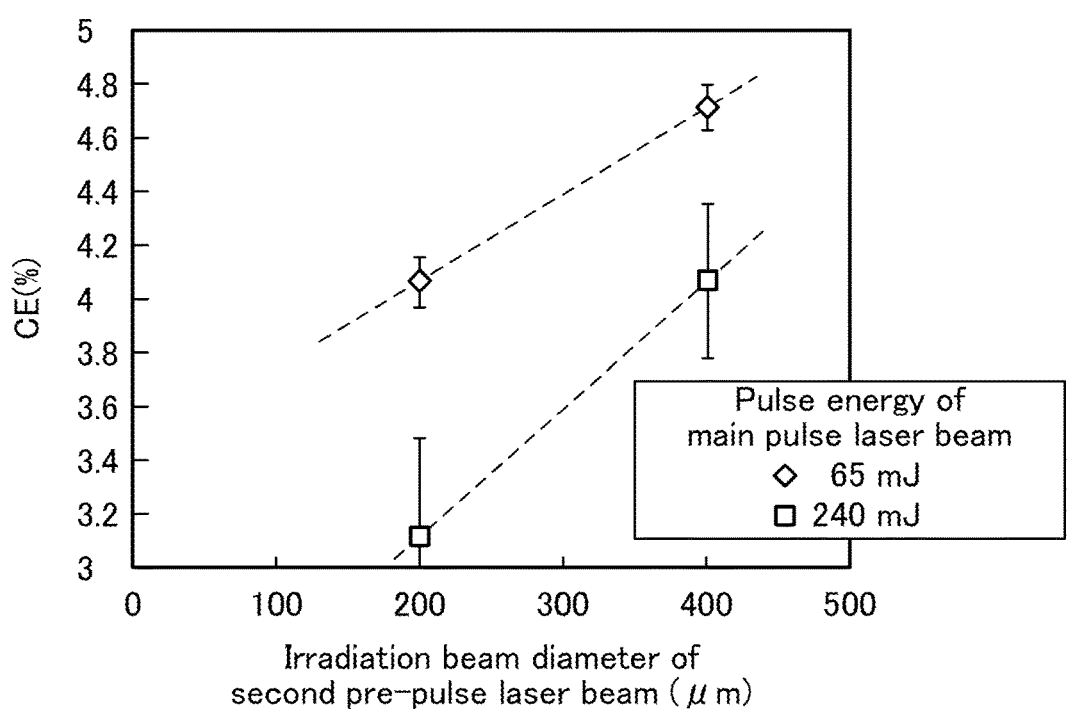
FIG. 7B is a graph showing a relationship between the irradiation beam diameter of the second pre-pulse laser beam and the conversion efficiency (CE) from the energy of the laser beam to the energy of the EUV light.

FIG. 7B is a graph showing a relationship between the irradiation beam diameter of the second pre-pulse laser beam P2 and the conversion efficiency (CE) from the energy of the laser beam to the energy of the EUV light. In FIG. 7B, the measurement was made both in the case where the pulse energy of the main pulse laser beam M was 65 mJ and in the case where that was 240 mJ. Other measurement conditions were substantially the same as those in FIG. 7A.

As shown in FIG. 7B, raising the pulse energy of the main pulse laser beam M from 65 mJ to 240 mJ caused the reduction of the conversion efficiency from the energy of the laser beam to the energy of the EUVW light. In the case where the irradiation beam diameter D2 of the second pre-pulse laser beam P2 was 200 μm, the conversion efficiency was significantly reduced from approximately 4.1% to approximately 3.1%. In contrast, in the case where the irradiation beam diameter D2 of the second pre-pulse laser beam P2 was 400 μm, the conversion efficiency was slightly reduced from approximately 4.7% to approximately 4.1%. The reduction of the conversion efficiency was thus moderated in the case where the irradiation beam diameter D2 of the second pre-pulse laser beam P2 was increased from 200 μm to 400 μm.

2.4.4 Numerical Range of Irradiation Beam Diameter

The numerical range of the irradiation beam diameter will be discussed below. First, variables used below are defined as follows.

Dd: A diameter of a droplet-shaped target

D1: An irradiation beam diameter of a first pre-pulse laser beam

D2: An irradiation beam diameter of a second pre-pulse laser beam

Dm: An irradiation beam diameter of a main pulse laser beam

Dt: A diameter of a tertiary target when being irradiated with the main pulse laser beam Dp: A diameter of plasma 2.4.4.1 Diameter Dd of Droplet-Shaped Target The diameter Dd of the target 27 may be in the following numerical range typically for an LPP type EUV light generating apparatus.

$$1\ \mu m \leq Dd \leq 100\ \mu m$$

2.4.4.2 Irradiation Beam Diameter D1 of First Pre-Pulse Laser Beam

The irradiation beam diameter D1 of the first pre-pulse laser beam P1 may be a 5% width or 50% width that is preferably be set to a value obtained by adding the deviation ΔDd of the position the target 27 to the diameter Dd of the target 27. Accordingly, as described below, the irradiation beam diameter D1 of the first pre-pulse laser beam P1 may be larger than the diameter Dd of the target 27.

$$D1 > Dd \quad \text{(Formula 1)}$$

The 5% width may be a diameter of a part of the pulse laser beam having 5% or higher intensity of the peak intensity in the intensity distribution at the position of the target irradiated with the pulse laser beam. The 50% width may be a diameter of a part of the pulse laser beam having 50% or higher intensity of the peak intensity in the intensity distribution at the position of the target irradiated with the pulse laser beam.

Here, let the diameter Dd of the target 27 be 20 μm, and let the deviation ΔDd of the position of the target 27 be 20 μm. The value obtained by adding the deviation ΔDd of the position of the target 27 to the diameter Dd of the target 27 may be 40 μm.

Assuming that the intensity distribution of the first pre-pulse laser beam P1 at the position of the target irradiated with the pulse laser beam is a Gaussian distribution, a beam having an irradiation beam diameter of 40 μm at 5% width may have an irradiation beam diameter of 68 μm at $1/e^2$ width, and a beam having an irradiation beam diameter of 40 μm at 50% width may have an irradiation beam diameter of 253 μm at $1/e^2$ width. Accordingly, the irradiation beam diameter D1 of the first pre-pulse laser beam P1 may be in the following range.

$$50 \ \mu m \leq D1 \leq 300 \ \mu m$$

The $1/e^2$ width may be a diameter of a part of the pulse laser beam having $1/e^2$ or higher intensity of the peak intensity in the intensity distribution at the position of the target irradiated with the pulse laser beam. Here, e may be the Napier's constant and $1/e^2$ may be approximately 13.5%.

2.4.4.3 Irradiation Beam Diameter Dm of Main Pulse Laser Beam

The irradiation beam diameter Dm of the main pulse laser beam M may be a beam diameter where the beam has an irradiation intensity to achieve high conversion efficiency from the energy of the laser beam to the energy of the KUV light. According to an experiment performed by the inventor of the present disclosure, an irradiation intensity of the main pulse laser beam M in a range from $5 \times 10^9$ W/cm$^2$ to $1 \times 10^{10}$ W/cm$^2$ is preferable for achieving high conversion efficiency from the energy of the laser beam to the energy of the EUV light. The irradiation intensity of the main pulse laser beam M will be described below with reference to FIG. 10. For example, if the pulse energy of the main pulse laser beam M is 400 mJ and the pulse width is 15 ns, the irradiation beam diameter Dm of the main pulse laser beam M may be in the following range.

$$450 \ \mu m \leq Dm \leq 900 \ \mu m$$

However, an EUV light generating apparatus as a light source of an exposure apparatus may have an upper limit of the diameter Dp of the plasma. The upper limit of the diameter Dp of the plasma may be determined by the magnification of the EUV collector mirror 23 and the etendue-limit of the intermediate focus region (IF). As described below, the irradiation beam diameter Dm of the main pulse laser beam M may be smaller than the diameter Dp of the plasma.

$$Dp > Dm \quad \text{(Formula 2)}$$

If the diameter Dp of the plasma is 400 μm, the irradiation beam diameter Dm of the main pulse laser beam M may be approximately 300 μm. Accordingly, the irradiation beam diameter Dm of the main pulse laser beam M may be larger than the irradiation beam diameter D1 of the first pre-pulse laser beam P1.

$$Dm > D1 \quad \text{(Formula 3)}$$

As shown in FIG. 6C, the irradiation beam diameter D of the main pulse laser beam M may be smaller than the diameter Dt of the tertiary target 273 when being irradiated with the main pulse laser beam M.

$$Dt > Dm$$

The diameter Dp of plasma may be smaller than the diameter Dt of the tertiary target 273 when being irradiated with the main pulse laser beam M.

$$Dt > Dp \quad \text{(Formula 4)}$$

2.4.4.4 Irradiation Beam Diameter D2 of Second Pre-Pulse Laser Beam

On the assumption of the description of FIGS. 6B and 6C, the irradiation beam diameter D2 of the second pre-pulse laser beam P2 may be equal to or larger than the diameter Dt of the tertiary target 273 when being irradiated with the main pulse laser beam M.

$$D2 \geq Dt \quad \text{(Formula 5)}$$

The upper limit of the irradiation beam diameter D2 of the second pre-pulse laser beam P2 may be determined by the distance between two adjacent targets 27. Assuming that the distance between the two adjacent targets 27 is 2000 μm, the upper limit of the irradiation beam diameter D2 of the second pre-pulse laser beam P2 may be 4000 μm.

In this embodiment, the irradiation beam diameter D2 of the second pre-pulse laser beam P2 may be larger than the irradiation beam diameter Dm of the main pulse laser beam M. Accordingly, the lower limit of the irradiation beam diameter D2 of the second pre-pulse laser beam P2 may be 300 μm.

Based on the above, the irradiation beam diameter D2 of the second pre-pulse laser beam P2 may be in the following range.

$$300 \ \mu m \leq D2 \leq 4000 \ \mu m$$

Preferably, the irradiation beam diameter D2 of the second pre-pulse laser beam P2 may be in the following range.

$$300 \ \mu m \leq D2 \leq 900 \ \mu m$$

Based on Formula 1 to Formula 5 described above, the following formula may be derived.

$$D2 \geq Dt > Dp > Dm > D1 > Dd$$

2.4.5 Range of Delay Time

According to an experiment performed by the inventor of the present disclosure, the delay time T1M and the delay time T2M may preferably be in the following range.

The delay time T1M from the time of irradiation with the first pre-pulse laser beam P1 to the time of irradiation with the main pulse laser beam M may preferably be in the following range.

$$0.5 \ \mu s < T1M < 3 \ \mu s$$

The delay time T1M will be described below with reference to FIG. 8.

The delay time T2M from the time of irradiation with the second pre-pulse laser beam P2 to the time of irradiation with the main pulse laser beam M may preferably be in the following range.

$$10 \ ns < T2M < 300 \ ns$$

More preferably, the delay time T2M may be in the following range.

50 ns<$T2M$<100 ns

Figure 8:
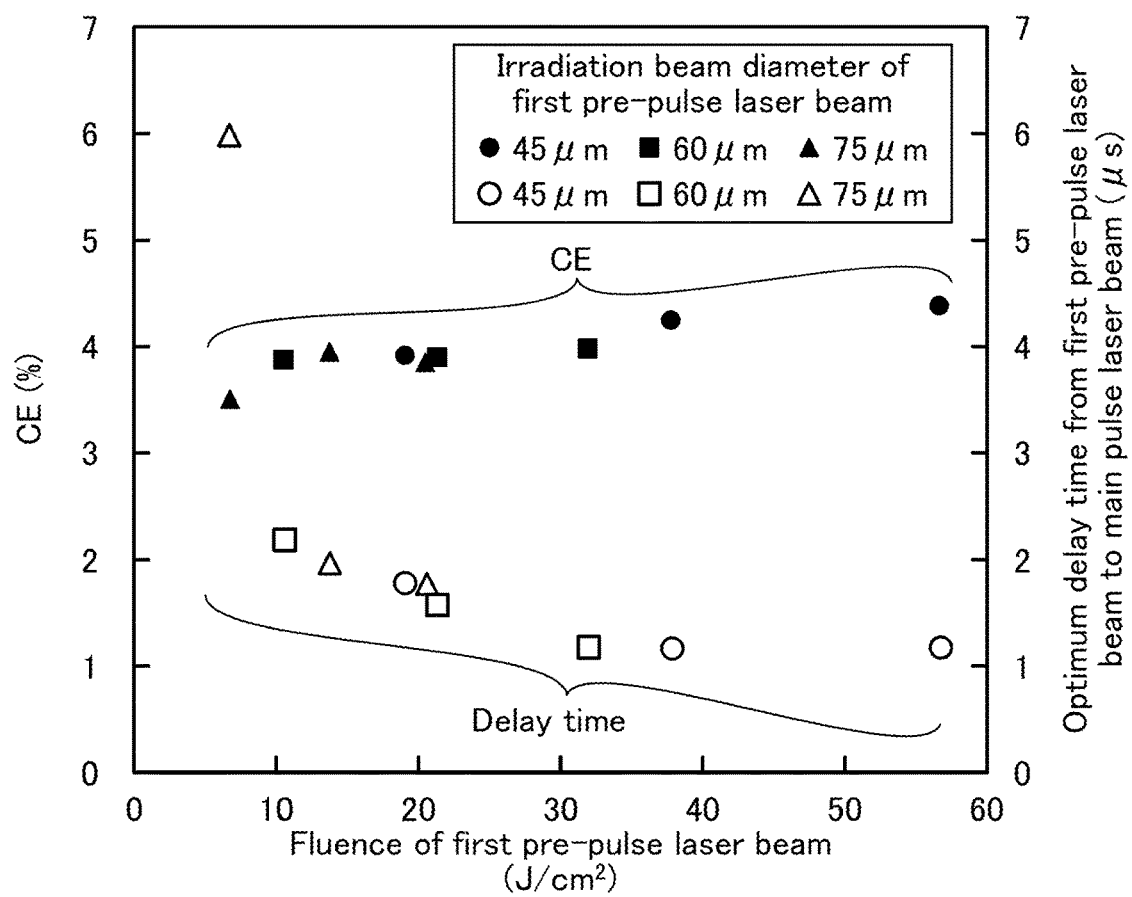
FIG. 8 shows a relationship between the fluence of the first pre-pulse laser beam P1 and the conversion efficiency (CE) from the energy of the laser beam to the energy of the EUV light.

2.4.6 Fluence or Irradiation Intensity of Pulse Laser Beam
2.4.6.1 Fluence of First Pre-Pulse Laser Beam FIG. 8 is a graph showing a relationship between the fluence of the first pre-pulse laser beam P1 and the conversion efficiency (CE) from the energy of the laser beam to the energy of the EUV light. FIG. 8 further shows a relationship between the fluence of the first pre-pulse laser beam P1 and an optimum value of the delay time T1M from the time of irradiation with the first pre-pulse laser beam P1 to the time of irradiation with the main pulse laser beam M.

In FIG. 8, a tin droplet having a diameter of 25 µm was used as the target 27. For the first pre-pulse laser beam P1, three values of the irradiation beam diameter were set and the pulse width was 14 ps. For the second pre-pulse laser beam P2, the pulse width was 12 ns, the pulse energy was 2 mJ, and the delay time T2M from the time of irradiation with the second pre-pulse laser beam P2 to the time of irradiation with the main pulse laser beam M was 120 ns. For the main pulse laser beam M, the irradiation beam diameter was 300 µm, the pulse width was 15 ns, and the pulse energy was 50 mJ.

With a constant value of the irradiation beam diameter and a constant value of the fluence of the first pre-pulse laser beam P1, the measurement was made for a plurality of values of the delay time TIM. A delay time TIM where the highest conversion efficiency was achieved was selected as an optimum delay time. The optimum delay time and the corresponding conversion efficiency are shown in FIG. 8.

As shown in FIG. 8, the fluence of the first pre-pulse laser beam P1 may be in a range from 5 J/cm$^2$ to 60 J/cm$^2$.

The delay time T1M from the time of irradiation with the first pre-pulse laser beam P1 to the time of irradiation with the main pulse laser beam M may be in the following range.

0.5 µs<$T1M$<3 µs

2.4.6.2 Fluence of Second Pre-Pulse Laser Beam

Figure 9:
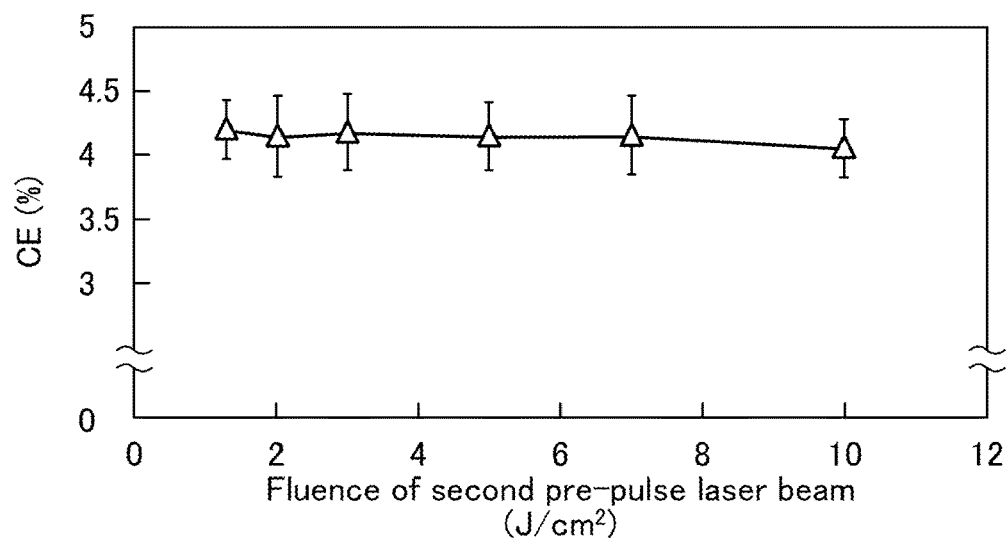
FIG. 9 is a graph showing a relationship between the fluence of the second pre-pulse laser beam P2 and the conversion efficiency (CE) from the energy of the laser beam to the energy of the EUV light.

FIG. 9 is a graph showing a relationship between the fluence of the second pre-pulse laser beam P2 and the conversion efficiency (CE) from the energy of the laser beam to the energy of the EUV light.

In FIG. 9, a tin droplet having a diameter of 25 µm was used as the target 27. For the first pre-pulse laser beam P1, the irradiation beam diameter was 80 µm, the pulse width was 14 ps, and the pulse energy was 0.77 mJ. For the second pre-pulse laser beam P2, the pulse width was 6 ns, the irradiation beam diameter was 400 µm, and the measurement was made with a plurality of values of the fluence. For the main pulse laser beam M, the irradiation beam diameter was 404 µm, the pulse width was 15 ns, and the pulse energy was 240 mJ.

As shown in FIG. 9, the fluence of the second pre-pulse laser beam P2 may be in a range from 1 J/cm$^2$ to 10 J/cm$^2$.

2.4.6.3 Irradiation Intensity of Main Pulse Laser Beam

Figure 10:
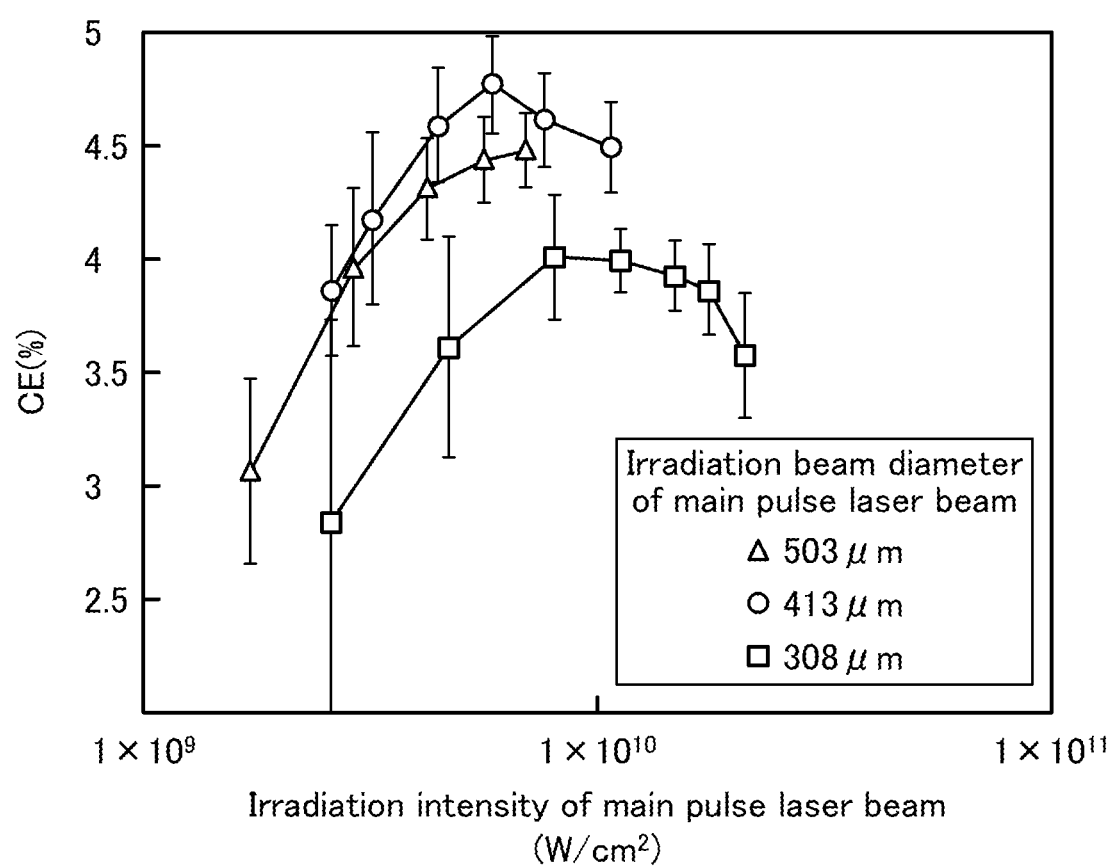
FIG. 10 is a graph showing a relationship between an irradiation intensity of the main pulse laser beam M and the conversion efficiency (CE) from the energy of the laser beam to the energy of the EUV light.

FIG. 10 is a graph showing a relationship between the irradiation intensity of the main pulse laser beam M and the conversion efficiency (CE) from the energy of the laser beam to the energy of the EUV light. In the present disclosure, "an irradiation intensity" may mean an intensity of a pulse laser beam at a position of a target irradiated with the pulse laser beam. The irradiation intensity may be an average value in a region having 1/e$^2$ or higher intensity of the peak intensity.

In FIG. 10, as the irradiation beam diameter Dm of the main pulse laser beam M, three values were set. Then, the measurement was made with a plurality of values of the irradiation intensity for each of the three values of the irradiation beam diameter Dn.

As shown in FIG. 10, the irradiation intensity of the main pulse laser beam M may preferably be in a range from 5×10$^9$ W/cm$^2$ to 1×10$^{10}$ W/cm$^2$.

3. Supplementary Explanation

The above descriptions are intended to be only illustrative rather than being limiting. Accordingly, it will be clear to those skilled in the art that various changes may be made to the embodiments of the present disclosure without departing from the scope of the appended claims.

The terms used in this specification and the appended claims are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in this specification and the appended claims should be interpreted as meaning "at least one" or "one or more".

The invention claimed is:

1. An extreme ultraviolet light generating apparatus comprising:
   a target supply unit configured to output a target toward a predetermined region;
   a laser system configured to output a first laser beam with which the target is irradiated, a second laser beam with which the target is irradiated after being irradiated with the first laser beam, and a third laser beam with which the target is irradiated after being irradiated with the second laser beam; and
   an optical system configured to cause an irradiation beam diameter of the second laser beam at the target to be larger than an irradiation beam diameter of the third laser beam at the target, wherein
   the target supply unit is configured to sequentially output a plurality of targets including the target, and
   the irradiation beam diameter of the second laser beam at the target is equal to or smaller than two times of a distance between two adjacent targets in the plurality of targets.

2. The extreme ultraviolet light generating apparatus according to claim 1, wherein the third laser beam is a laser beam to turn the target into plasma to generate extreme ultraviolet light.

3. The extreme ultraviolet light generating apparatus according to claim 1, wherein the irradiation beam diameter of the second laser beam at the target is larger than a diameter of the target at a time of being irradiated with the second laser beam.

4. The extreme ultraviolet light generating apparatus according to claim 1, wherein an irradiation beam diameter of the first laser beam at the target is smaller than the irradiation beam diameter of the third laser beam at the target.

5. The extreme ultraviolet light generating apparatus according to claim 4, wherein the optical system includes an adjustment mechanism provided in an optical path of the first laser beam and configured to adjust the irradiation beam diameter of the first laser beam at the target.

6. The extreme ultraviolet light generating apparatus according to claim 1, wherein the optical system includes an adjustment mechanism provided in an optical path of the second laser beam and configured to adjust the irradiation beam diameter of the second laser beam at the target.

7. The extreme ultraviolet light generating apparatus according to claim 1, wherein the optical system includes an adjustment mechanism provided in an optical path of the third laser beam and configured to adjust the irradiation beam diameter of the third laser beam at the target.

8. The extreme ultraviolet light generating apparatus according to claim 1, wherein the optical system is provided in an optical path of the second laser beam and configured to adjust the irradiation beam diameter of the second laser beam at the target in a range from 300 μm to 4000 μm.

9. The extreme ultraviolet light generating apparatus according to claim 1, wherein the laser system is configured to adjust a fluence of the second laser beam at the position of the target in a range from 1 J/cm² to 10 J/cm².

10. The extreme ultraviolet light generating apparatus according to claim 1, wherein the laser system is configured to adjust a pulse width of the second laser beam to a value shorter than a pulse width of the third laser beam.

11. The extreme ultraviolet light generating apparatus according to claim 1, wherein the laser system is configured to adjust a delay time from a time of irradiation with the first laser beam to a time of irradiation with the third laser beam in a range from 0.5 μs to 3 μs.

12. The extreme ultraviolet light generating apparatus according to claim 1, wherein the laser system is configured to adjust a delay time from a time of irradiation with the second laser beam to a time of irradiation with the third laser beam in a range from 0.01 μs to 0.3 μs.

13. The extreme ultraviolet light generating apparatus according to claim 1, wherein the laser system is configured to further output a fourth laser beam with which the target is irradiated after being irradiated with the first laser beam and before being irradiated with the second laser beam.

14. The extreme ultraviolet light generating apparatus according to claim 13, wherein the laser system is configured to further output a fifth laser beam with which the target is irradiated after being irradiated with the second laser beam and before being irradiated with the third laser beam.

15. An extreme ultraviolet light generating apparatus comprising:

a target supply unit configured to output a target toward a predetermined region;

a laser system configured to output a first laser beam with which the target is irradiated, a second laser beam with which the target is irradiated after being irradiated with the first laser beam, and a third laser beam with which the target is irradiated after being irradiated with the second laser beam; and an optical system configured to cause an irradiation beam diameter of the second laser beam at the target to be larger than an irradiation beam diameter of the third laser beam at the target, wherein the irradiation beam diameter of the second laser beam at the target is equal to or larger than a diameter of the target at a time of being irradiated with the third laser beam.

16. The extreme ultraviolet light generating apparatus according to claim 15, wherein the optical system is provided in an optical path of the second laser beam and configured to adjust the irradiation beam diameter of the second laser beam at the target in a range from 300 μm to 4000 μm.

17. The extreme ultraviolet light generating apparatus according to claim 15, wherein the laser system is configured to adjust a fluence of the second laser beam at the position of the target in a range from 1 J/cm² to 10 J/cm².

18. The extreme ultraviolet light generating apparatus according to claim 15, wherein the laser system is configured to adjust a pulse width of the second laser beam to a value shorter than a pulse width of the third laser beam.

19. The extreme ultraviolet light generating apparatus according to claim 15, wherein the laser system is configured to adjust a delay time from a time of irradiation with the first laser beam to a time of irradiation with the third laser beam in a range from 0.5 μs to 3 μs.

20. The extreme ultraviolet light generating apparatus according to claim 15, wherein the laser system is configured to adjust a delay time from a time of irradiation with the second laser beam to a time of irradiation with the third laser beam in a range from 0.01 μs to 0.3 μs.

* * * * *